United States Patent
He

(10) Patent No.: US 7,593,824 B2
(45) Date of Patent: Sep. 22, 2009

(54) SYSTEM AND METHOD FOR AUTOMATION OF HARDWARE SIGNAL CHARACTERIZATION AND SIGNAL INTEGRITY VERIFICATION

(75) Inventor: Jane He, Ottawa (CA)

(73) Assignee: Plant Equipment, Inc., Temecula, CA (US)

( * ) Notice: Subject to any disclaimer, the term of this patent is extended or adjusted under 35 U.S.C. 154(b) by 0 days.

(21) Appl. No.: 11/845,685

(22) Filed: Aug. 27, 2007

(65) Prior Publication Data

US 2008/0288195 A1 Nov. 20, 2008

Related U.S. Application Data

(60) Provisional application No. 60/938,417, filed on May 16, 2007.

(51) Int. Cl.
*G06F 19/00* (2006.01)
*G01R 25/00* (2006.01)

(52) U.S. Cl. ............... 702/65; 702/117; 326/30; 326/82; 340/538.14; 338/216

(58) Field of Classification Search .......... 702/6, 702/117; 326/30, 82; 340/538.14; 338/216; 343/822; 307/409; 379/394
See application file for complete search history.

(56) References Cited

U.S. PATENT DOCUMENTS

| | | | |
|---|---|---|---|
| 6,026,456 A | 2/2000 | Ilkbahar | |
| 6,356,106 B1 | 3/2002 | Greeff et al. | |
| 6,486,696 B1 * | 11/2002 | Cao | 326/30 |
| 6,535,945 B1 | 3/2003 | Tobin et al. | |
| 6,541,996 B1 * | 4/2003 | Rosefield et al. | 326/30 |
| 6,971,077 B1 | 11/2005 | Frank et al. | |
| 7,239,180 B1 * | 7/2007 | Shumarayev | 326/82 |
| 2005/0285698 A1 | 12/2005 | Kim | |
| 2006/0226867 A1 | 10/2006 | Goh | |

OTHER PUBLICATIONS

International Publication for PCT/US2008/063776, filed May 15, 2008.
International Search Report for PCT/US2008/063776, filed May 15, 2008.
Written Opinion for PCT/US2008/063776, filed May 15, 2008.
Written Opinion from PCT/US2008/063776, dated Apr. 14, 2009 (Our Ref: PLNTEQ.026VPC).

* cited by examiner

*Primary Examiner*—Edward Raymond
*Assistant Examiner*—Elias Desta
(74) *Attorney, Agent, or Firm*—Knobbe Martens Olson & Bear LLP

(57) ABSTRACT

A PCB comprising two or more components, such as ICs, comprises drivers and receivers that facilitate communication of signals between the components. Signal terminations, such as series and AC terminations, are used to increase the integrity of signals transmitted between components. Advantageously, values of the terminations are determined using a computerized method comprising sequential adjustment of on-chip programmable resistors and/or capacitors on chips coupled to the PCB. Thus, the effect of various values of on-chip termination resistors and/or capacitors on signal integrity is actually tested on the PCB, rather than simulating using software, for example, in order to determine optimal termination values. Characteristics of on-chip programmable resistors and/or capacitors may be adjusted by writing values into registers of the corresponding chips. The termination testing may be performed at various temperature and humidity settings corresponding to expected use environments in order to observe signal integrity at specific use environments.

23 Claims, 12 Drawing Sheets

AC Terminations ← 1020

| Termination Scheme Number | Resistance (Ohms) | Capacitance (microFarads) |
|---|---|---|
| 1 | 10 | 0.001 |
| 2 | 10 | 0.01 |
| 3 | 10 | 0.1 |
| 4 | 10 | 1 |
| 5 | 10 | 10 |
| 6 | 10 | 100 |
| 7 | 22 | 0.001 |
| 8 | 22 | 0.01 |
| 9 | 22 | 0.1 |
| 10 | 22 | 1 |
| 11 | 22 | 10 |
| 12 | 22 | 100 |
| 13 | 39 | 0.001 |
| 14 | 39 | 0.01 |
| 15 | 39 | 0.1 |
| 16 | 39 | 1 |
| 17 | 39 | 10 |
| 18 | 39 | 100 |
| 19 | 62 | 0.001 |
| 20 | 62 | 0.01 |
| 21 | 62 | 0.1 |
| 22 | 62 | 1 |
| 23 | 62 | 10 |
| 24 | 62 | 100 |
| 25 | 75 | 0.001 |
| 26 | 75 | 0.01 |
| 27 | 75 | 0.1 |
| 28 | 75 | 1 |
| 29 | 75 | 10 |
| 30 | 75 | 100 |

1010 → row 4; 1015 → row 5; 1030 → row 24

Series Terminations ← 1022

| Termination Scheme Number | Resistance (Ohms) |
|---|---|
| 1 | 10 |
| 2 | 22 | ← 1020
| 3 | 39 |
| 4 | 62 |
| 5 | 75 |

Ambient Profiles ← 1024

| Profile | Humidity (%) | Temperature (°C) |
|---|---|---|
| A | 0 | 0 |
| B | 0 | 27 | ← 1031
| C | 0 | 50 |
| D | 50 | 0 |
| E | 50 | 27 |
| F | 50 | 50 |
| G | 95 | 0 |
| H | 95 | 27 |
| I | 95 | 50 |

FIG. 10

|     | Ambient Profile | Termination Scheme | Driver Output | Receiver Input | Match Flag | Sequential Matches |     |
|-----|-----------------|--------------------|---------------|----------------|------------|--------------------|-----|
|     |                 | ↓ 1110             | ↓ 1120        | ↓ 1130         | ↓ 1140     | ↓ 1150             | ↓ 1160 |
|     | A | 1 | 0 | 0 | 1 | 1 |  |
|     | A | 1 | 1 | 0 | 0 | 0 |  |
|     | A | 2 | 0 | 0 | 1 | 1 |  |
|     | A | 2 | 1 | 0 | 0 | 0 |  |
| 1161 → | A | 3 | 0 | 0 | 1 | 1 | ← 1167 |
| 1162 → | A | 3 | 1 | 1 | 1 | 2 | ← 1168 |
| 1163 → | A | 4 | 0 | 0 | 1 | 3 | ← 1169 |
| 1164 → | A | 4 | 1 | 1 | 1 | 4 | ← 1170 |
| 1165 → | A | 5 | 0 | 0 | 1 | 5 | ← 1171 |
|     | A | 5 | 1 | 0 | 0 | 0 |  |
|     | A | 6 | 0 | 0 | 1 | 1 |  |
|     | A | 6 | 1 | 0 | 0 | 0 |  |
|     | B | 1 | 0 | 0 | 1 | 1 |  |
|     | B | 1 | 1 | 0 | 0 | 0 |  |
|     | B | 2 | 0 | 0 | 1 | 1 |  |
|     | B | 2 | 1 | 0 | 0 | 0 |  |
|     | B | 3 | 0 | 0 | 1 | 1 |  |
|     | B | 3 | 1 | 0 | 0 | 0 |  |
|     | B | 4 | 0 | 0 | 1 | 1 |  |
|     | B | 4 | 1 | 1 | 1 | 2 |  |
|     | B | 5 | 0 | 1 | 0 | 0 |  |
|     | B | 5 | 1 | 1 | 1 | 1 |  |
|     | B | 6 | 0 | 0 | 1 | 2 |  |
|     | B | 6 | 1 | 0 | 0 | 0 |  |
|     | C | 1 | 0 | 0 | 1 | 1 |  |
|     | C | 1 | 1 | 0 | 0 | 0 |  |
|     | C | 2 | 0 | 0 | 1 | 1 |  |
|     | C | 2 | 1 | 1 | 1 | 2 |  |
|     | •••• | •••• | •••• | •••• | •••• | •••• |  |

SYSTEM AND METHOD FOR AUTOMATION OF HARDWARE SIGNAL CHARACTERIZATION AND SIGNAL INTEGRITY VERIFICATION

CROSS-REFERENCE TO RELATED APPLICATIONS

This application claims priority from U.S. Provisional Application No. 60/938,417, filed May 16, 2007, which is hereby incorporated by reference in its entirety.

BACKGROUND OF THE INVENTION

1. Field of the Invention

This invention relates to the termination of signal traces of a Printed Circuit Board (PCB), and more particularly to systems and methods of optimizing signal integrity through automated adjustment and testing of various combinations of termination component values.

2. Description of the Related Technology

Advances in integrated circuit (IC) manufacturing design have allowed PCB designers to integrate tremendous numbers of various ICs onto a PCB. For example, modern PCBs often have a large number of ICs in addition to hundreds of other discrete components. When designing digital circuits, especially those operating at higher speeds, engineers have to take into consideration many environmental variables inherent in the components and their interconnection with the PCB in order to reduce signal degradation between components of the PCB.

PCB's may comprise multiple layers of thin copper etched to form paths that carry signals from component(s) to component(s). At high signal rates, these paths start to have non-negligible impedances that can affect the circuit functionality. These parasitic impedances are normally inductive and mitigated using corrective resistive and capacitive loads called terminations, judiciously located on the PCB.

When the circuit turns into a distributed system, meaning that the PCB trace length exceeds one-sixth of the electrical length of a rising edge, for example, the PCB trace becomes a transmission line. An ideal transmission line will deliver the electrical signals from component to component without any loss or corruption. Non-ideal transmission lines may incur signal loss as the electrical signal travels through the length of the transmission line and a portion of the electrical signal is reflected towards other transmission lines. The reflected wave of the electrical signal combines with the reflective wave of the other electrical signals altering both wavers amplitude, modulation, and relative phase. To reduce electrical signal corruption, transmission lines may be coupled to terminations.

To minimize distortion of the transmitted digital data, transmission lines may be coupled to terminations on the PCB near the component(s). If the transmission line is not terminated with its characteristic impedance, the input impedance may exhibit inductive and/or capacitive characteristics depending on the nature of the load.

Termination design, which is typically a part of the PCB and layout design, is a fundamental and critical technique used to maintain signal integrity. It improves timing margin and mitigates Electro-Magnetic Interference (EMI) that creates noise and crosstalk. Proper terminations may also reduce overshoot and/or undershoot of electrical signal's, which are when the electrical signal voltage exceeds a high or low respective circuit power rail, which in turn increases the lifetime of the device.

Signal characterization is part of the test and verification process during the prototype PCB debugging stage. Verifying proper terminations is the process of measuring the effect of the timing margins, EMI effects, crosstalk, and/or other effects on the signal during the hardware PCB signal characterization stage. Circuits designed with poor signal integrity may not function within restricted ranges of inputs, temperature, and life expectancy, thus reducing the overall quality of the product, or the circuit may not work at all.

Signal characterization is a highly iterative process as the PCB layout is generated when the electronic design is complete. Since the electronic design might be affected by the PCB layout, the process of signal characterization may include a second or third PCB layout to fine-tune the electronic design. These iterations are very expensive, extremely wasteful, and very time consuming. Because PCBs may comprise hundreds, thousands, or more nets/traces per design, signal characterization is often performed only on selected critical signals. Thus, the integrity of signals on the non-characterized traces may not be verified in the design stage.

Current systems for characterizing a PCB include manually soldering and unsoldering discrete resistors and/or capacitors to the PCB and then testing the signal integrity of the PCB using a high speed digital oscilloscope and low impedance probes, for example. As those of skill in the art will recognize, however, manual soldering, unsoldering and testing using oscilloscopes does not always represent real world scenarios.

Also, as the throughput of a PCB is demanded to be higher and higher, the bus width typically gets wider and wider. Many PCB designs are required to terminate the whole data or address buses. If the bus is 32 bits or 64 bits wide or higher, it may create challenges to terminate the bus on the PCB. For example, the PCB may not have real estate to place a multitude of termination components and so the traces must be constrained to meet the layout requirements.

In addition, it has always been highly troublesome or even impossible to terminate a point-to-multipoint bus, a bi-directional bus, or the combination of both. The topology of the PCB can vary greatly and terminating various bus topologies is a very long, enduring task, involving multiple iterations of adjusting terminations and testing signal integrity on the PCB.

Accordingly, there is a need for systems and methods of automating signal integrity testing in order to optimize the termination layout on a multi-chip PCB.

SUMMARY

In one embodiment, a computerized method for determining termination characteristics associated with a connection between a signal driver of a first chip on a printed circuit board and a signal receiver of a second chip on the printed circuit board, at least one of the first and second chips comprising one or more of a software programmable resistor and a software programmable capacitor coupled to the connection, comprises (a) determining one or more possible values for at least one of the programmable resistor and the programmable capacitor, (b) selecting one of the determined possible values for at least one of the programmable resistor and the programmable capacitor, (c) transmitting a first signal to at least one of the programmable resistor and the programmable capacitor coupled to the connection, the signal configured to initiate adjustment of at least one of a resistance value of the programmable resistor and a capacitor value of the programmable capacitor to the selected one of the determined possible values, (d) transmitting a second signal to the first chip initiating output of a test signal having a known value from the signal driver, (e) receiving a third signal from the printed circuit board indicating a received value of the test signal received by the signal receiver of the second chip, (f) determining a signal integrity of the test signal based at least partly on a difference between the known value of the transmitted test signal and the received value of the test signal, (g) repeating steps (b)-(e) for at least some of the determined possible values, and (h) determining values for at least one of the programmable resistor and the programmable capacitor based at least on a comparison of the determined signal integrities associated with respective possible values of at least one of the programmable resistor and the programmable capacitor.

In one embodiment, a system for determining values of each of a plurality of terminations coupled to connections between chips on a printed circuit board comprises a test environment for housing the printed circuit board, a computing device configured to output signals to the printed circuit board, the output signals configured to sequentially adjust resistance values of digitally programmable resistors of chips on the printed circuit board in order to adjust termination characteristics of corresponding terminations, wherein the computing device is further configured to initiate transmission of one or more known signals across electrical connections between chips on the printed circuit board as resistance values of the digitally programmable resistors are being sequentially adjusted and to determine resistance values that substantially optimize integrity of the known signals across respective connections.

In one embodiment, a method of determining at least a resistance value for a driver termination on a chip comprises (a) selecting a resistor value from a plurality of resistor values of an on-chip programmable resistor of the chip, (b) transmitting from a computing device to the chip a signal indicating the selected resistor value, (c) adjusting the on-chip programmable resistor towards the selected resistor value, (d) transmitting from a computing device to the chip a communication signal indicating a test signal to be output from a driver of the chip, the driver being electrically coupled to a connection of a printed circuit board, the connection being further coupled to a receiver of a second chip, (e) sensing a received test signal value indicating a value of the transmitted test signal that is received by the receiver of the second chip, (f) if additional resistor values remain to be tested, repeating steps (a)-(d), (g) determining an optimal resistor value for the on-chip programmable resistor based at least partly on a comparison of respective test signals and received test signals associated with respective resistor values.

BRIEF DESCRIPTION OF THE DRAWINGS

FIG. 10 illustrates an exemplary AC termination table, an exemplary series termination table, and an exemplary ambient profile table.

FIG. 11 is an exemplary log file indicating test results using various ambient profiles and termination schemes.

DETAILED DESCRIPTION OF CERTAIN EMBODIMENTS

Embodiments of the invention will now be described with reference to the accompanying Figures, wherein like numerals refer to like elements throughout. The terminology used in the description presented herein is not intended to be interpreted in any limited or restrictive manner, simply because it is being utilized in conjunction with a detailed description of certain specific embodiments of the invention. Furthermore, embodiments of the invention may include several novel features, no single one of which is solely responsible for its desirable attributes or which is essential to practicing the inventions herein described.

As used herein, the terms "trace," "path," "connection," and "transmission line" each refer to electrical connections, such as connections between one or more components on a PCB. The junction of two or more electrical connections forms a "node."

As used herein, the term "electrical signal" and "signal" refer to electrical signals, such as analog and/or digital data signals, that may be received by a PCB, transmitted on one or more traces on the PCB, and/or transmitted from the PCB to other devices.

As used herein, the terms "microchip," "chip," and "IC" refer to miniaturized electronic circuits constructed of individual semiconductor devices and/or passive components that are bonded to a substrate. A chip may comprise, for example, a processor or a memory device.

Figure 1:
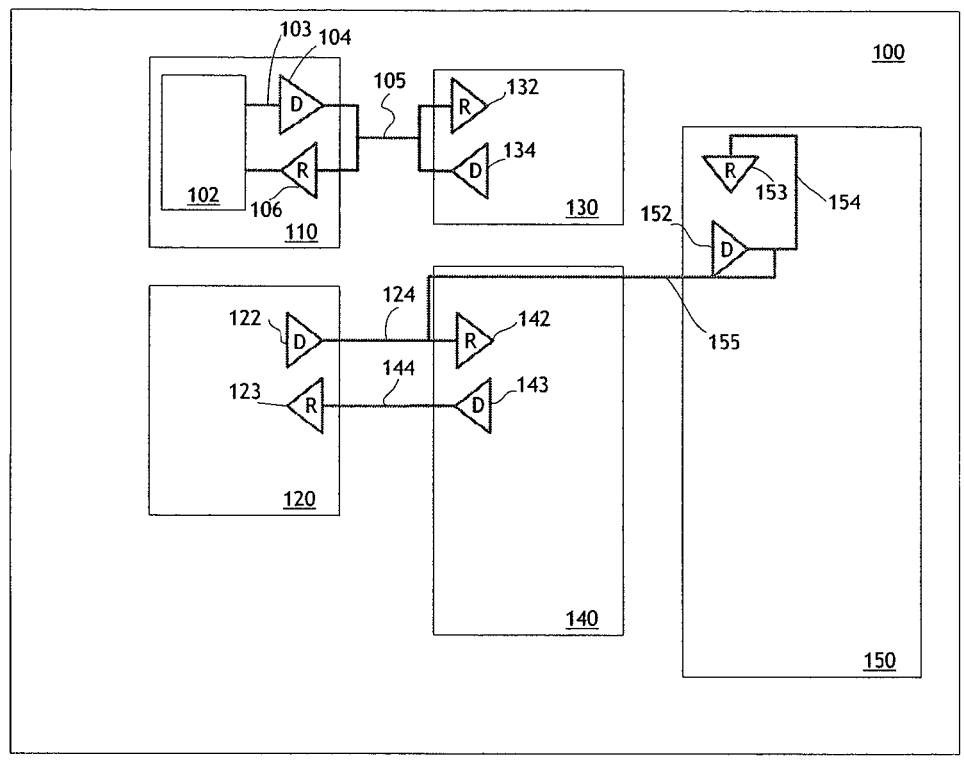
FIG. 1 is a schematic diagram of an exemplary PCB comprising of a plurality of chips selectively interconnected by connections on the PCB.

FIG. 1 is a schematic diagram of an exemplary PCB 100 comprising of a plurality of chips 110, 120, 130, 140, 150 selectively interconnected by the paths 105, 124, 144, 154, 155. The PCB 100 and the corresponding chips 110, 120, 130, 140, 150, may comprise any electronic device that is capable of sending and receiving electronic signals, such as the motherboard of a computing device, for example. In the embodiment of FIG. 1, drivers and receivers (104, 106, 122, 123, 132, 134, 142, 143, 152, and 153) are physically connected to their respective chip IO pads/pins. Thus, the drivers and receives may communicate with external devices via electrical connections to the corresponding chip pads or pins. Depending on the embodiment, the PCB 100 may comprise fewer or additional chips coupled with different paths.

The exemplary PCB 100 is generally populated with discrete components, such as ICs, resistors, capacitors, inductors, bus systems, and Random Access Memory channels (RAM), for example. Each of these discrete components exhibits its own impedance which can be resistive, capacitive, inductive, or a combination of impedances. In addition to the discrete components, an IC may exhibit its own programmable impedance by the use of an on-chip resistance and on-chip capacitance embedded in the IC during the manufacturing stage of the IC. In one embodiment, on-chip resistance/capacitance in an IC comprises one or more software programmable resistors and/or capacitors embedded in the IC that may be adjusted by a designer of the PCB.

As noted above, at high signal rates the paths of the PCB start to have non-negligible impedances that can affect the circuit functionality. The board of a typical PCB with no discrete components electrically coupled to itself is generally manufactured to either have a 50 ohm impedance or a 75 ohm impedance. Terminating the PCB 100 generally involves matching the impedance of the discrete components with the onboard impedance of the PCB 100 and the corresponding tracers characteristic impedance. In the embodiment of FIG. 1, matching impedances of the discrete components 110, 120, 130, 140, 150 and the PCB 100 increases a likelihood that signals transmitted on those paths are clear and non-distorted.

The exemplary PCB 100 comprises a chip 120 with a signal driver 122 and a signal receiver 123 in communication with chip 140 over paths 124 and 144. As used herein, the terms "signal driver" and "signal receiver" will be referred to as "driver" and "receiver," respectively. Thus, the receiver 123 of chip 120 is coupled to receive electrical signals from the driver 143 of chip 140, and the receiver 142 of chip 140 is coupled to receive electrical signals from the driver 122 of chip 120 or driver 152 of chip 150. In a digital circuit, the electrical signals transmitted and received by the drivers and receivers may be either logic high, corresponding to a binary "1," or logic low, corresponding to a binary "0." For example, a logic high may be transmitted as an analog signal of +3V or +5V, while a logic low signal may be transmitted as an analog signal of 0V. As those of skill in the art will recognize, various other representations of binary values may be used in digital circuits. The systems and methods described herein are not specific to any one digital signaling system, but instead should be interpreted to cover any signaling system.

In the embodiment of FIG. 1, the signal output by driver 143 to receiver 123 comprises a signal that is determined by the circuitry of the chip 140, which may vary according to the configuration of chip 140 and the inputs to the chip 140, such as via the receiver 142. The topology of a single driver transmitting a signal to a single receiver is known as a point-to-point topology. Accordingly, the trace 144 between the driver 143 and receiver 123 defines a point-to-point communication path between chips 140 and 120.

In the embodiment of FIG. 1, the driver 104 of chip 110 is configured to transmit an electrical signal to receiver 132 of chip 130 via path 105 and the driver 134 of chip 130 is configured to transmit an electrical signal to receiver 106 of chip 110 via the same path 105. In this embodiment, the path 105 defines a bi-directional communication path wherein electrical signals are transmitted may be transmitted in either direction. In this embodiment, the drivers of chips 110, 130 may be alternatively enabled such that communication on the path 105 is uni-directional at any point in time. In the embodiment of FIG. 1, chip 110 comprises a logical device 102, which may comprise one or more of a memory, processor, amplifier, bipolar junction transistor (BJT), MOSFET, and any number of ICs or discrete components, for example. Although not illustrated in FIG. 1, the chips 120, 130, 140, 150 each comprise one or more electrical devices coupled to the receiver and/or drivers of the chips.

In the embodiment of FIG. 1, the driver 152 is configured to transmit an electrical signal to both a receiver 153 of chip 150 and a receiver 142 of chip 140. The topology of a driver sending a known signal to multiple receivers is known as a point-to-multipoint topology. Accordingly, the traces 154 and 155 define point-to-multipoint communication paths between the driver 152 and receivers 153 and 142. chips 150 and 140.

Figure 2:
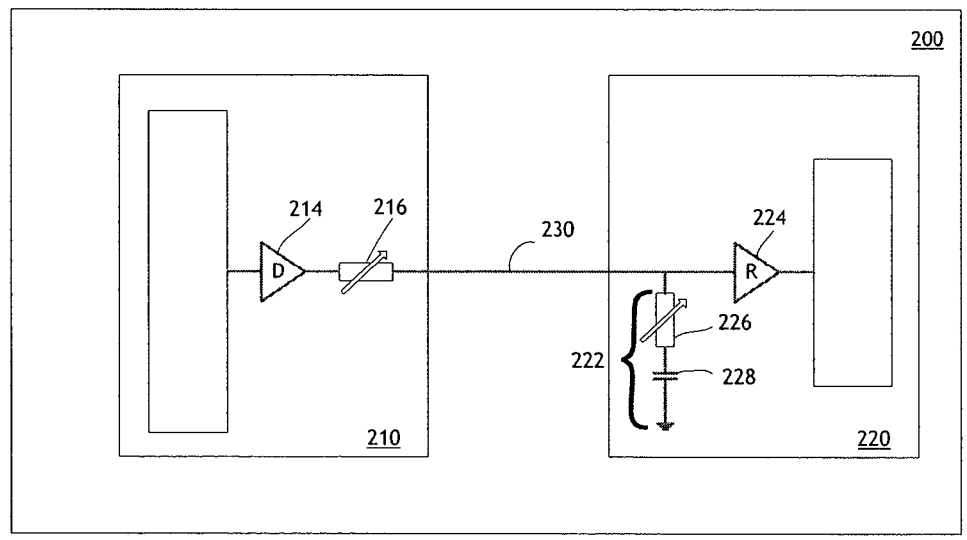
FIG. 2 is a schematic diagram illustrating an exemplary PCB comprising chips having on-chip series terminations, the chips being coupled in a point-to-point unidirectional topology.

FIG. 2 is a schematic diagram illustrating an exemplary PCB 200 comprising chips 210, 220 comprising on-chip series terminations, the chips being coupled in a point-to-point unidirectional topology. In one embodiment, series terminations, comprising one or more resistive element, are positioned near drivers, while AC terminations, comprising one or more resistive and capacitive elements, are positioned near receivers. Series terminations are aptly named because a resistance, such as the on-chip software programmable resistor 216 of chip 210 is placed in series with the output of the driver 214. The AC termination 222 of chip 220 comprises a software programmable resistor 226 in series with a software programmable capacitor 228, connected to ground, where the AC termination 222 is parallel with the input of the receiver 224.

As described in further detail below, the use of on-chip terminations, such as the programmable resistors 216, 226 and capacitor 228 of FIG. 2, allow software adjustment of termination characteristics at design, prototyping, and/or troubleshooting stages of PCB design/use. In one embodiment, characteristics of the on-chip programmable resistors and capacitors may be adjusted by writing values into registers of the corresponding chip. For example, chip 210 may comprise a register bank storing values indicating a resistive value of programmable resistor 216. Accordingly, by programmatically changing the resistive value stored in the register bank, such as via a digital connection to a computing device, the value of the programmable resistor 216 is correspondingly adjusted.

Figure 3:
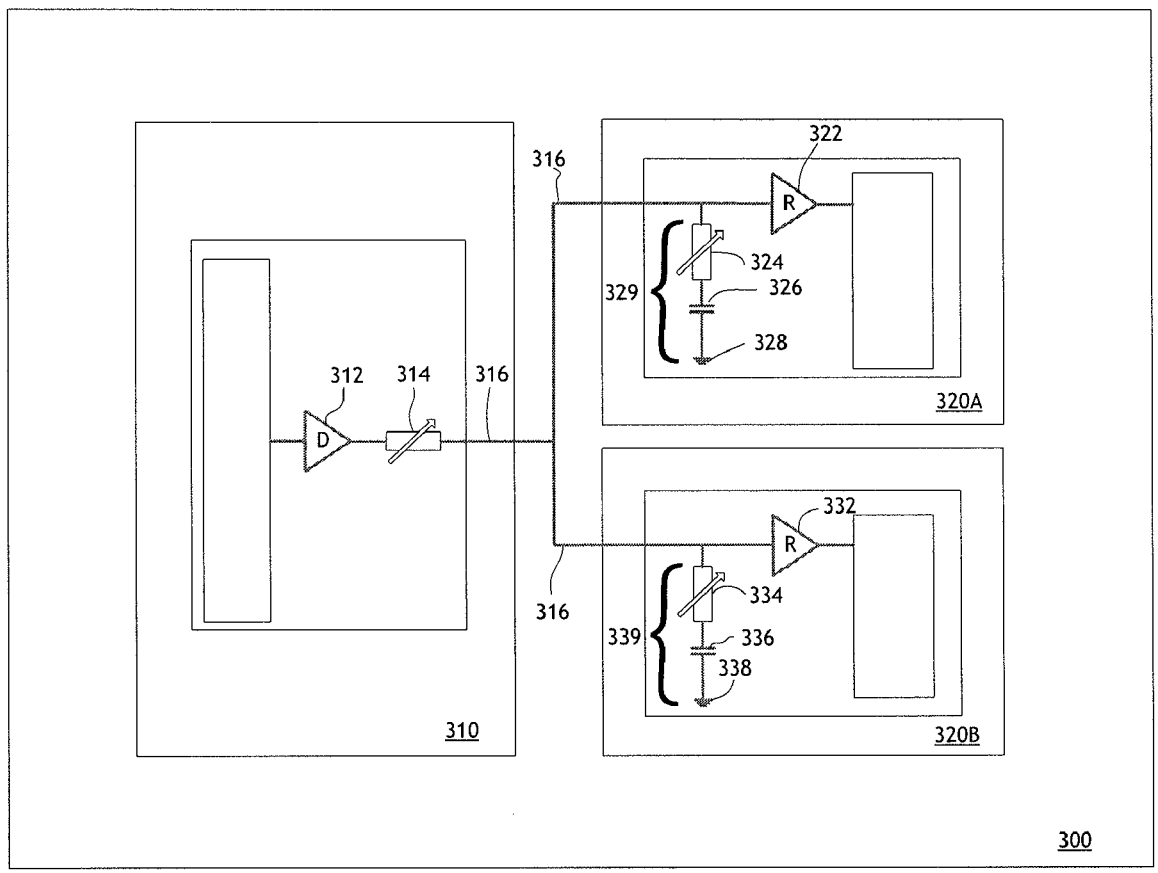
FIG. 3 is a schematic diagram illustrating an exemplary PCB with a point-to-multipoint topology.

FIG. 3 is a schematic diagram illustrating an exemplary PCB 300 with a point-to-multipoint topology. Exemplary PCB 300 comprises a Central Processing Unit (CPU) 310 connected to a memory 320A and a memory 320B via path 316. In one embodiment, there are a plurality of memory chips 320 each in communication with the CPU 300 via path 316.

In the embodiment of FIG. 3, an on-chip series resistor 314 is positioned proximate the driver 312 on CPU 310. In this embodiment, on-chip terminations 329, 339 are positioned near receivers 322, 332 of chips 320A, 320B, respectively. In the embodiment of FIG. 3, the on-chip terminations 329, 339 comprise AC terminations, each having a programmable on-chip resistor 324, 334 in series with a programmable on-chip capacitor 326, 336. With on-chip terminations positioned near the receivers 322, 332, and driver 312, the values of the termination components may be adjusted in order to optimize the integrity of signals between the chips. For example, the resistors 314, 324, 334 and capacitors 326, 336 may be iteratively adjusted to various combinations of values by a software algorithm executing on a computing device coupled to the PCB 300, where the signal integrity of signals transmitted on the path 316 may be monitored as the values of the terminations are adjusted in order to determine an optimal combination of termination values. Computerized systems and methods for testing signal integrity across PCB traces are discussed in further detail below.

Depending on the embodiment, the determination of how to terminate transmission paths on a PCB, such as the paths 316 of PCB 300, may be partly based on the line impedance of the PCB. For series termination, exemplary resistance values of the PCB usually range from zero to the line impedance of the PCB, which may be 50 or 75 ohms, for example. For AC terminations, the resistance values may be closer to the line impedance of the PCB.

Figure 4:
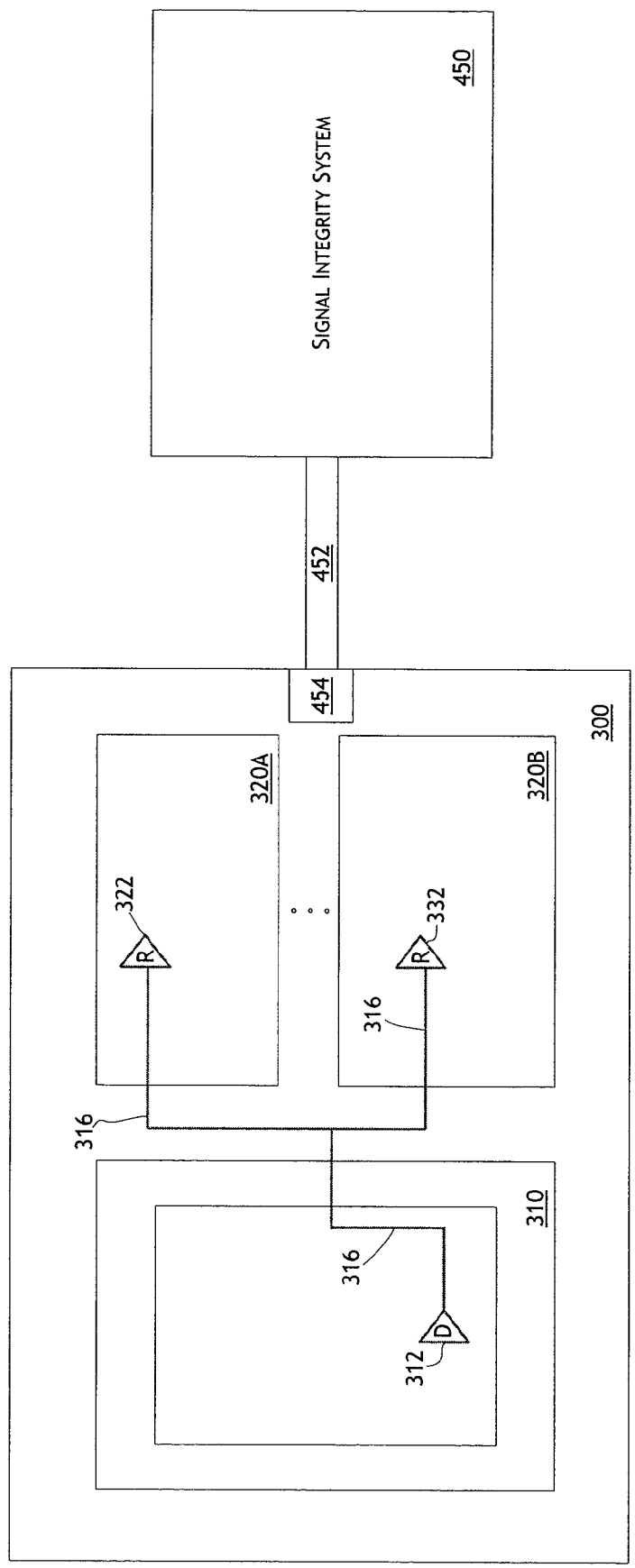
FIG. 4 is a schematic diagram illustrating one embodiment of a signal integrity system coupled to the exemplary PCB of FIG. 3.

FIG. 4 is a schematic diagram illustrating one embodiment of a signal integrity system 450 coupled to the exemplary PCB 300 of FIG. 3. The signal integrity system 450 is configured to test the integrity of signals transmitted on PCB traces, such as path 316, with various combinations of termination values. In one embodiment, the signal integrity system 450 causes the driver 312 to output known signals to one or more receivers 322, 332 on the PCB 300 and then monitors the signals received by the receivers 322, 332. In this embodiment, based on the comparison of the sent and received signals, the signal integrity system 450 may systematically adjust the termination values for one or both of the driver and receiver until a desired signal integrity is reached. In the embodiment of FIG. 4, the characterization of the PCB 300 via the signal integrity system 450 is done remotely and may be independent of any human intervention throughout the characterization process.

The exemplary signal integrity system 450 comprises a connection interface 452 that couples with an access interface 454 of the PCB 300 in order to allow the signal integrity system to investigate and/or control operations of the PCB 300 and the chips thereon. In one embodiment, the signal integrity system 450 is configured to read and/or set register values associated with the drivers and receives of the chips on the PCB 300 via communication of data signals on the connection interface 452. Depending on the embodiment, the connection interface 452 comprises a Joint Test Action Group (JTAG), in-circuit emulator (ICE), on-circuit debugger (OCD), background debug module (BDM) interface, serial interface, parallel interface, and/or any other suitable data transmission interface. Depending on the embodiment, the connection interface 452 may comprise from 1-64 or more pins that are configured to receive and/or transmit data signals from the PCB 300 when the connection interface 452 is coupled to the access interface 454 of the PCB 300. The data signals communicated on the connection interface 452 allow the signal integrity system 450 to monitor the signals being transmitted between chips of the PCB 300, such as by reading values of register associated with respective drivers and receivers. In an advantageous embodiment, data signals indicating desired values of respective on-chip terminations may be transmitted from the signal integrity system 450 to the PCB 300 via the connection interface 452, such that the on-chip termination values are remotely programmable by the signal integrity system 450.

Figure 5:
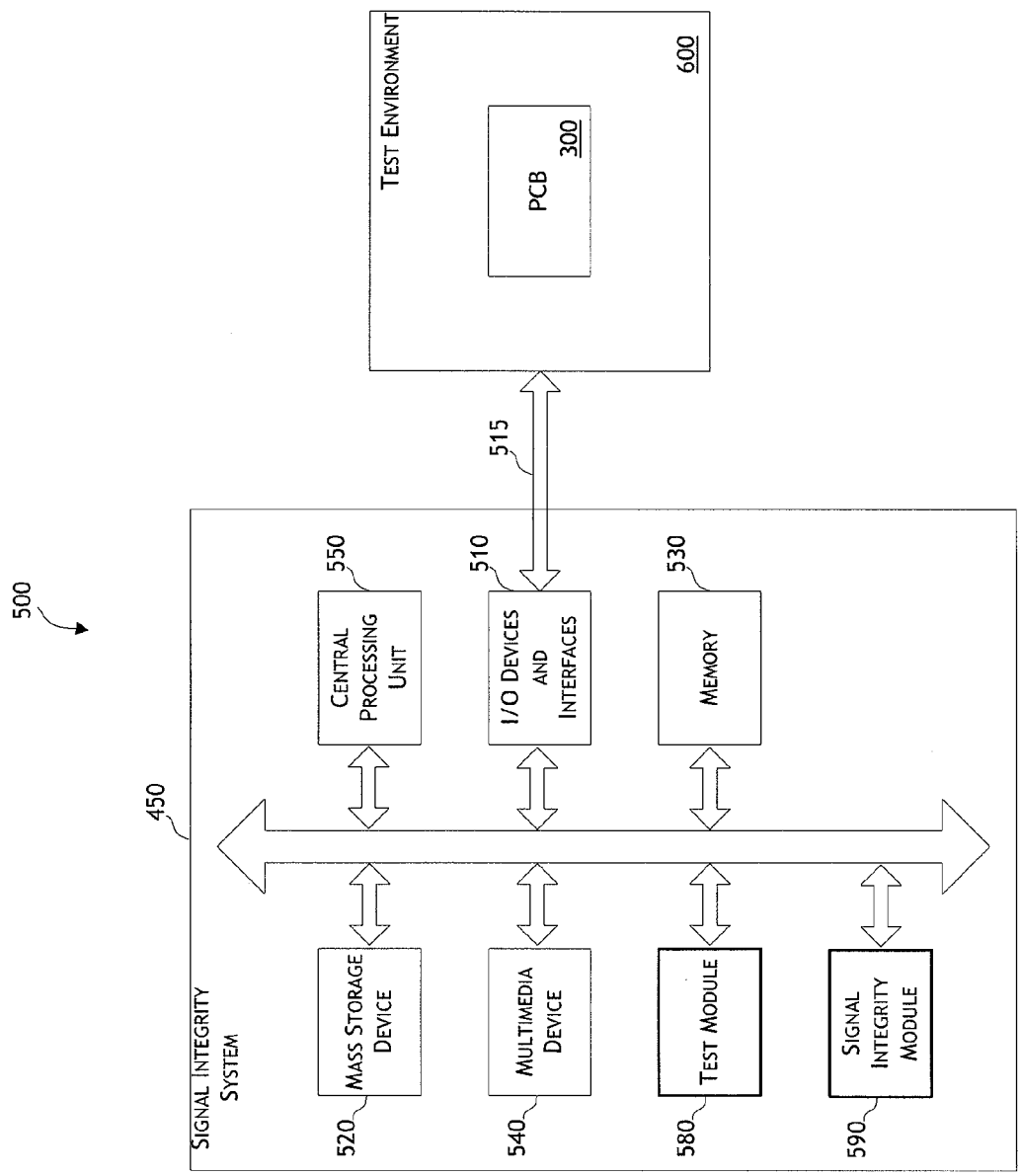
FIG. 5 is a block diagram of a PCB test environment comprising the signal integrity system of FIG. 4 in communication with the PCB of FIG. 3.

FIG. 5 is a block diagram of a PCB test environment 500 comprising the signal integrity system 450 in communication with a PCB 300. The PCB test environment 500 may be used to implement certain systems and methods described herein. Depending on the embodiment, the functionality described below with reference to certain components and modules of the computing system 500 may be combined into fewer components and modules or further separated into additional components or modules.

The exemplary signal integrity system 450 comprises computing device, such as a desktop, notebook, server, or hand-held computer, for example. In the embodiment of FIG. 5, the signal integrity system 450 comprises a memory 530, such as random access memory (RAM) for temporary storage of information and a read only memory (ROM) for permanent storage of information, and a mass storage device 520, such as a hard drive, diskette, or optical media storage device. The mass storage device 520 may comprise one or more hard disk drive, optical drive, networked drive, or some combination of various digital storage systems. The signal integrity system 450 also comprises a central processing unit (CPU) 550 for computation. Typically, the modules of the signal integrity system 550 are in data communication via one or more standards-based bus system. In different embodiments of the present invention, the standards based bus system could be Peripheral Component Interconnect (PCI), Microchannel, SCSI, Industrial Standard Architecture (ISA) and Extended ISA (EISA) architectures, for example.

The signal integrity system 450 is generally controlled and coordinated by operating system software, such as the UNIX, Linux, Ubuntu, Windows 95, 98, NT, 2000, XP, Vista, or other compatible operating systems. In Macintosh systems, the operating system may be any available operating system, such as Mac OS X. In other embodiments, the signal integrity system 450 may be controlled by a proprietary operating system. Conventional operating systems control and schedule computer processes for execution, perform memory management, provide file system, networking, and I/O services, and provide a user interface, such as a graphical user interface (GUI), among other things.

The exemplary signal integrity system 450 includes one or more of commonly available input/output (I/O) devices and interfaces 510, such as a keyboard, mouse, touchpad, and printer. In one embodiment, the I/O devices and interfaces 510 include one or more display devices, such as a monitor, that allows the visual presentation of data to a user. More particularly, display devices provide for the presentation of GUIs, application software data, and multimedia presentations, for example. In one embodiment, a GUI includes one or more display panes in which the termination results may be displayed. The signal integrity system 450 may also include one or more multimedia devices 540, such as speakers, video cards, graphics accelerators, and microphones, for example.

In the embodiment of FIG. 5, the I/O devices and interfaces 510 provide a communication interface to various external devices. In the embodiment of FIG. 5, the signal integrity system 450 is in data communication with a test environment 600, which houses one or more PCBs. A communication link 515 carries communication signals between the signal integrity system 450 and the test environment 600. In one embodiment, the communication link 515 comprises one or more connection interfaces, such as JTAG or BDM connection interfaces, for example, configured to communicate data signals between the signal integrity system 450 and the PCB 300 housed in the test environment 600. In one embodiment, the communication link 515 carries programming signals to registers associated with on-chip resistors and/or capacitors of the PCB 300 in order to initiate adjustment of values of the on-chip terminations. Depending on the embodiment, the signal integrity system 450 may communicate with a plurality of PCBs via the I/O devices and interfaces 510, such as via a plurality of JTAG and/or BDM connection interface.

In general, the word "module," as used herein, refers to logic embodied in hardware or firmware, or to a collection of software instructions, possibly having entry and exit points, written in a programming language, such as, for example, Java, Lua, C or C++. A software module may be compiled and linked into an executable program, installed in a dynamic link library, or may be written in an interpreted programming language such as, for example, BASIC, Perl, or Python. It will be appreciated that software modules may be callable from other modules or from themselves, and/or may be invoked in response to detected events or interrupts. Software instructions may be embedded in firmware, such as an EPROM. It will be further appreciated that hardware modules may be comprised of connected logic units, such as gates and flip-flops, and/or may be comprised of programmable units, such as programmable gate arrays or processors. The modules described herein may be implemented as either software or hardware modules. Generally, the modules described herein refer to logical modules that may be combined with other modules or divided into sub-modules despite their physical organization or storage.

The exemplary signal integrity system comprises a test module 580 that is configured to transmit signals to the PCB 300 in order to initiate transmission of known signals from drivers of the PCB 300. For example, in order to initiate output of a signal from the driver 312 of chip 310 (FIG. 3), the test module 580 may write a value corresponding to either a "1" or "0" to a register associated with driver 312 on the PCB 300. The driver 312 then transmits the corresponding signal (either a logical "1" or a logical "0") on the transmission path 316 such receivers 322, 332 receive the transmitted signal and, in one embodiment, store a representation of the received signal in corresponding receiver registers. Thus, in one embodiment values of register associated with drivers and receivers may be read by the signal integrity system in order to determine the electrical signals that are transmitted and received. Ideally, the values stored in the receivers register associated with the receivers 322, 332 should be the same as the value stored in the register associated with the driver 312. However, as noted above, the integrity of signals on certain traces may be compromised due to one or more of several factors, resulting in changes in the signal value as the signal travels from the driver to the receivers. Thus, the test module 580 comprises software configured to methodically adjust termination values, e.g., values of on-chip termination resistors and/or capacitor, in order to identify termination values that optimize signal integrity between PCB components. In one embodiment, the test module 580 records the read register values from the driver 312 and receivers 322, 332 into a log file so that the signal integrity at various combinations of termination values may be analyzed and an optimal termination scheme may be determined.

The exemplary signal integrity system comprises a signal integrity module 590 configured to analyze the results of the testing performed by the test module 580 and determine optimal terminations for the PCB. In one embodiment, for example, the signal integrity module analyze a log file generated by the test module 580 and determines optimal termination values for each of a plurality of on-chip terminations.

Figure 9:
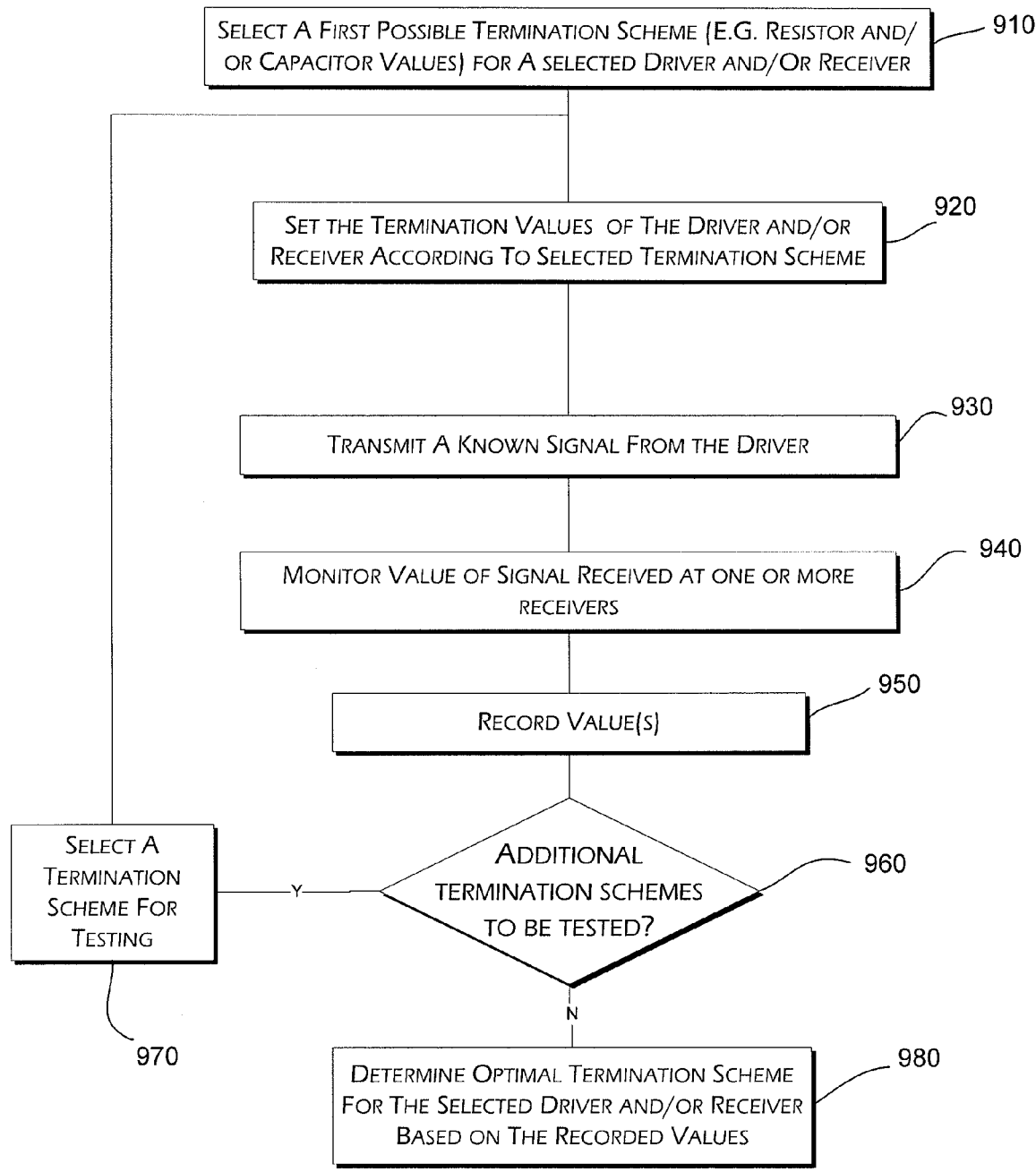
FIG. 9 is a flowchart illustrating one embodiment of programmatically adjusting termination values of series and/or AC terminations coupled to a connection of a PCB in order to determine optimal values for the terminations in maintaining signal integrity on the connection.

In one embodiment, termination schemes comprising resistor and/or capacitor values to be tested on the chips of the PCB 300 are accessed by the test module 580 in order to determine values for the on-chip terminations. For example, FIG. 9 illustrates an AC termination table 1020 comprising a plurality of AC termination schemes, each comprising a different combination of resistance and capacitance values. FIG. 9 also illustrates a series termination table 1022 comprising a plurality of series terminations, each comprising different resistance values. In one embodiment, the signal integrity system 590 cycles through the possible termination schemes, such as the exemplary termination schemes illustrated in FIG. 10, and accordingly initiates adjustment of the software programmable resistors/capacitors to the corresponding values of the termination schemes. The test module 580 then transmits a known value to the register of the driver 312, causing driver 312 to transmit a known value, and reads the registers of the receivers 322, 332 storing an indication of the actual received values. The signal integrity module 590 may then analyze the transmitted and received values of the electrical signal with different termination schemes applied to the drivers and/or receivers in order to determine the optimal termination schemes. In one embodiment, the signal integrity module 590 analyzes the driver and/or receiver register values as they are being read by the test module 580 and may modify the termination schemes that are used by the test module for particular transmission paths based on the already-received test results. In other embodiments, the signal integrity module 590 analyzes a log file of the test module 580 after each of a plurality of termination schemes have already been tested on each of one or more transmission paths. In either embodiment, the signal integrity module 590 is configured to select termination schemes for the on-chip terminations that provide the optimal signal integrity.

Figure 6:
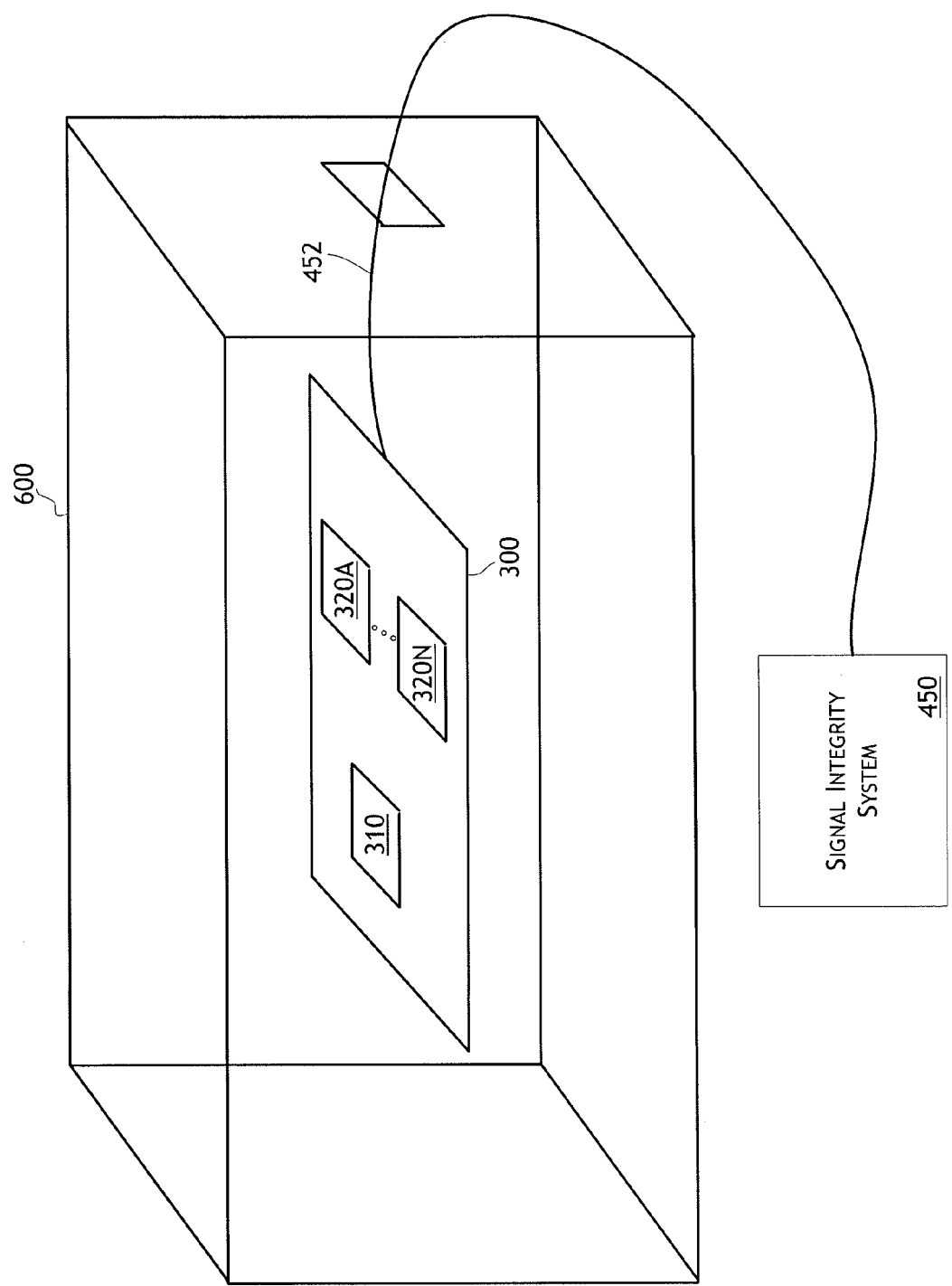
FIG. 6 is a schematic diagram illustrating an exemplary test environment housing the PCB of FIG. 3.

FIG. 6 is a schematic diagram illustrating an exemplary test environment 600 housing the PCB 300, wherein the PCB 300 is coupled to the signal integrity system 450 for termination testing and optimization. In the embodiment of FIG. 6, the test environment 600 comprises a temperature and/or humidity adjustable chamber. Thus, the PCB 300 may be tested under various combinations of temperature and/or humidity conditions in order to analyze signal integrity under those various conditions. In one embodiment, the test environment 600 comprises an enclosed rectangular structure which may continually adjust the ambient environment inside the chamber, such as in response to commands received from the test module 580 of the signal integrity system 450. As noted above, use of the test environment 600 allows testing of the PCB 300 under a varying array of possible temperature and/or humidity conditions that the PCB 300 would face in a real world ambient environment. The test environment 600 accelerates real world ambient environments such that an expected ten year lifespan of the PCB 300, or other multi-year lifespan, can be simulated in a few hours or less using the test environment 600 and the signal integrity system 450. In one embodiment, the PCB 300 may be tested by the signal integrity system 450 without the test environment 600, such as by placing the PCB 300 on a static-free tabletop surface.

Figure 7:
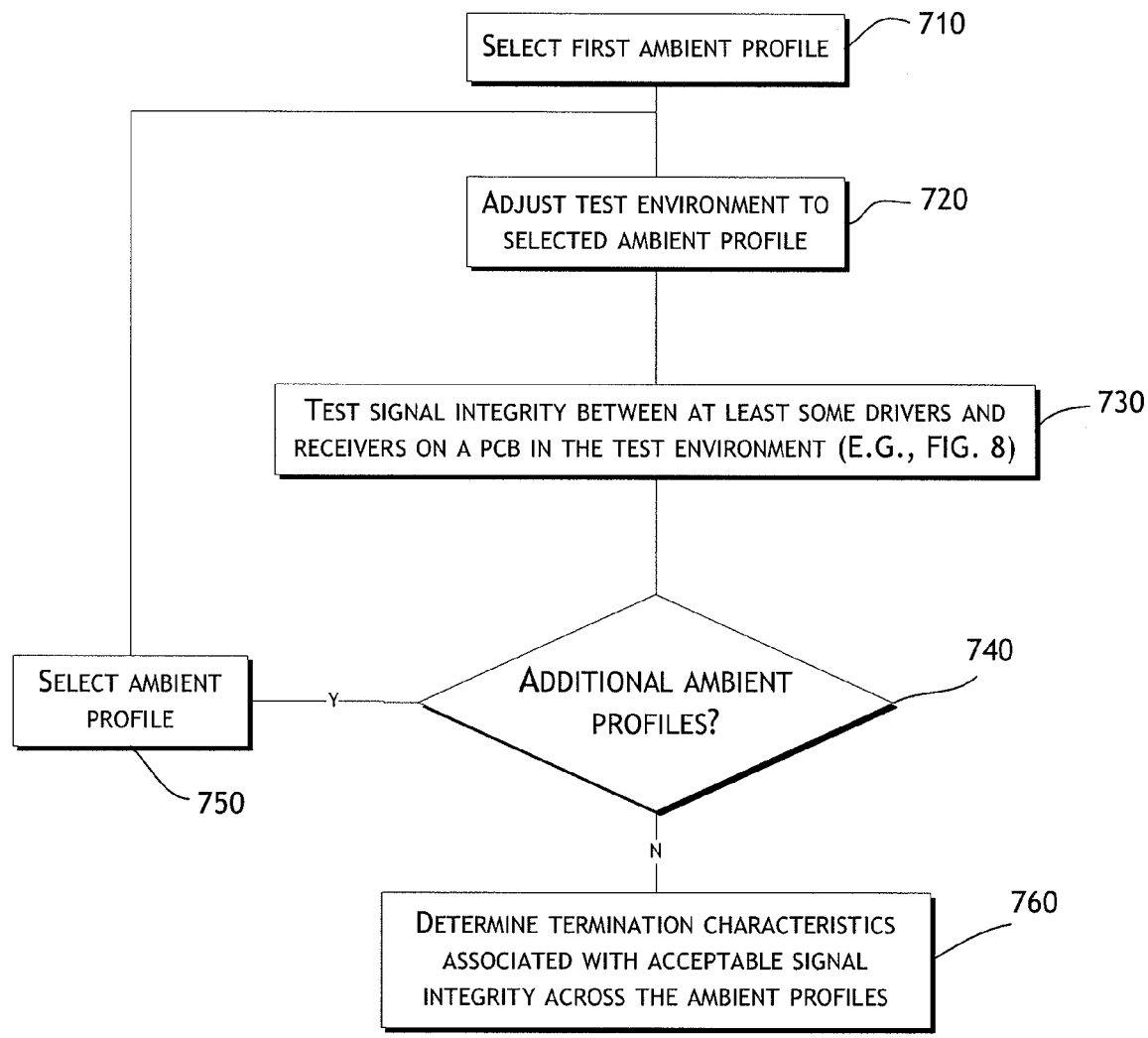
FIG. 7 is a flowchart illustrating one embodiment of a method of testing the signal integrity between at least some drivers and receivers on the PCB of FIG. 3 in the test environment of FIG. 6.

FIG. 7 is a flowchart illustrating one embodiment of a method of testing the signal integrity between at least some drivers and receivers on the PCB 300 in the test environment 600. In this embodiment, the PCB 300 is enclosed in the test environment 600 and connected to the signal integrity system 450 via connection interface 452, for example. Depending on the embodiment, the flowchart of FIG. 7 may comprise fewer or more blocks and the blocks may be performed in a different order than illustrated.

Beginning in block 710, a first ambient profile is selected, such as from the exemplary ambient profile table 1024 in FIG. 10. In the ambient profile table 1024, both humidity and temperate are adjusted so that three different temperatures (e.g., 0, 27, and 50 degrees Celsius) are each tested at three different humidities (e.g., 0, 50, and 95 percent humidity). In other embodiments, the ambient profiles may comprises adjustments to only a single ambient characteristics, such as temperature, or to additional ambient characteristics, such as wind speed and atmospheric pressure, for example. In one embodiment, the first ambient profile may simulate where the PCB 300 will be eventually be situated, such as in an office environment or in a steel mill.

Moving to block 720, the test environment 600 is adjusted to the selected ambient profile. In one embodiment, liquid hydrogen gas is slowly pumped into the test environment 600 to simulate a cold environment. The test chamber may need several minutes or several hours to adjust to the selected first ambient profile.

Figure 8:
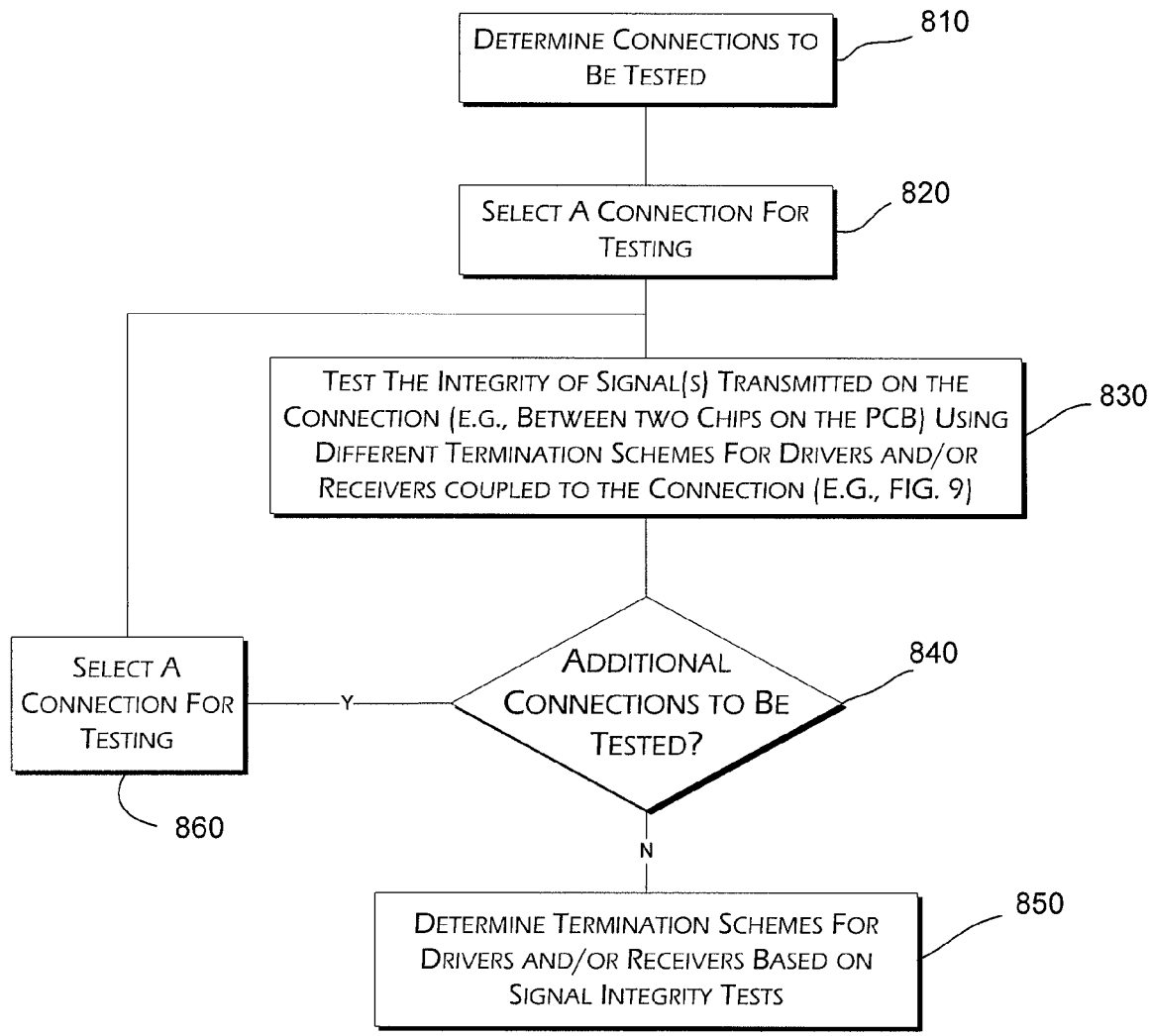
FIG. 8 is a flowchart illustrating one embodiment of a method of selecting a connection for testing and testing the signal integrity of one or more signals transmitted on the connection using different termination schemes for the corresponding driver and receiver(s).

Next, in block 730, the signal integrity between at least some drivers and receivers on the PCB 300 is tested by adjusting termination values of on-chip terminations of the PCB 300 using the test module 580 and the signal integrity module 590 of the signal integrity system 450. FIG. 8, described in further detail below, describes an exemplary method of testing signal integrity.

Moving to decision block 740, the signal integrity system 450 determines if the PCB is to be tested in additional ambient atmospheres. If no additional ambient profiles are to be used in testing the PCB, the method continues to block 760 where the signal integrity module 590 determines the proper termination scheme for at least some of the on-chip terminations of the PCB, such as termination values for the driver 312 and receiver 322, 332 on the PCB 300. If additional termination schemes are to be used in testing the PCB, the method moves to block 750 where another ambient profile is selected, and then returns to block 720 where the test environment is adjusted to the selected ambient profile.

Figure 13:
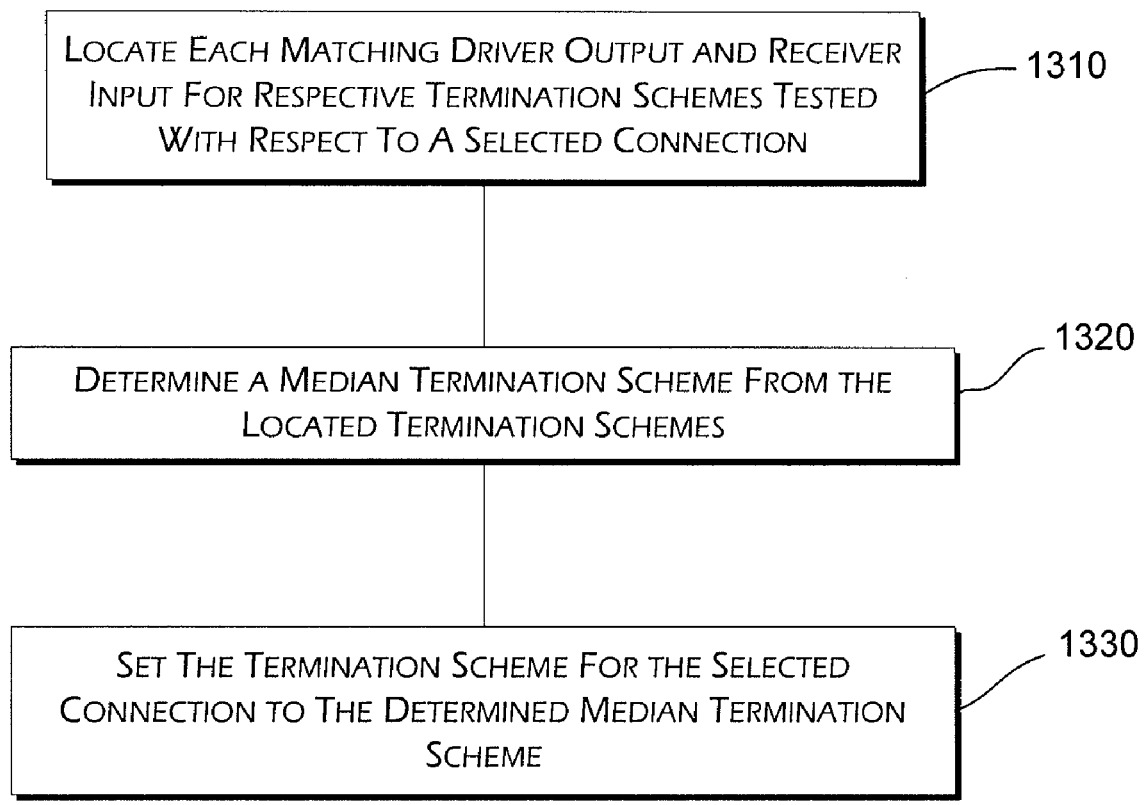
FIG. 13 is a flowchart illustrating one embodiment of a method of determining the optimal termination scheme for a selected driver and/or receiver, based at least partly on the results of signal integrity testing.

Continuing to block 760, the optimal termination characteristics for certain of the drivers and/or receivers of the PCB are determined, based on the results of the signal integrity testing (e.g., FIG. 8) performed on the PCB under different ambient conditions and using various termination schemes. An exemplary method for selecting the proper termination scheme for both the driver 312 and receivers 322, 332 is illustrated in FIG. 13. In general, if terminations are too weak at the driver, then it causes excessive overshoot or undershoot at the receiver side that may damage chipsets and also potentially generates crosstalk to nearby victim signals and if the termination is too strong at the driver, then it slows down the rise edge and violates the timing.

In one embodiment, once the proper termination schemes have been determined for the driver 312 and receivers 322, 332, then the software programmable on-chip resistors/capacitors can be programmed to the selected values. In another embodiment, discrete resistor(s)/capacitor(s) whose value(s) correspond to the termination scheme values can be soldered onto the PCB 300 using JEDEC guidelines near driver 312 and receiver 322, 332.

FIG. 8 is a flowchart illustrating one embodiment of a method of selecting a connection between chips on a PCB and testing the signal integrity of one or more signals transmitted on the connection using different termination schemes for the corresponding driver and receiver(s), such as driver 312 and receivers 322, 332 of PCB 300. Depending on the embodiment, the flowchart of FIG. 8 may comprise fewer or more blocks and the blocks may be performed in a different order than illustrated.

Moving to block 810, the signal integrity system 450 determines which connections between one or more components need to be characterized. In one embodiment, characterization of the PCB 300 may comprise testing of signal integrity on only certain critical connections between components. In other embodiments, the signal integrity system 450 can characterize signal integrity on both major and minor connections between components. In one embodiment, the signal integrity system 450 communicates with the chips of the PCB 300 via a connection interface, such as a JTAG or BDM connection interface, for example. In an advantageous embodiment, the connection interface allows the signal integrity system 450 to read value of registers associated with respective drivers and receivers, wherein the registers store data values indicative of current electrical signal levels that are being transmitted or received by the respective driver or receiver. Thus, by accessing the driver and/or receiver registers via a connection interface, the signal integrity system 450 may monitor signals that are transmitted and/or received by chips of the PCB 300.

Next, in block 820, a connection between a driver, such as driver 312, and one or more receivers or nodes, such as receivers 322, 332, is selected for testing by the signal integrity system 450. In one embodiment, the signal integrity system 450 will test the critical connections first. In another embodiment, the signal integrity system 450 will test all of the connections of the PCB 300. The sequence of connections tested may be determined by the signal integrity system 450.

Moving to block 830, the integrity of the signal(s) transmitted on the connection (e.g. between one or more chips on the PCB 300), using different termination schemes for the drivers and/or receivers coupled to the connection, is tested. Here, the test module 580 transmits a known signal, e.g., corresponding to a logical high or a logical low, to the register of a driver associated with a driver coupled to the selected connection, causing the driver to output a known value on the selected connection. The value of the signal that is received by one or more receivers coupled to the selected connection is then determined, such as by reading registers associated with the one or more registers. The value of the transmitted signal and of the received signal may then be recorded in a log file by the signal integrity system 450. In one embodiment, if the value of the receiver's register, such as registers associated with receivers 322, 332, varies from the value of the driver's register, such as a register associated with driver 312, then the termination scheme currently applied to the chips may not be optimal. FIG. 9, described in further detail below, illustrates an exemplary method of testing the integrity of signals using a plurality of termination schemes.

In one embodiment, the system integrity module 590 holistically selects the appropriate termination scheme for the driver 312 and receivers 322, 332. For example, when evaluating a connection between a driver and receiver that is next to another connection or node between another driver and receiver, the system integrity module 590 may consider the termination effects of both connections or nodes when selecting the proper termination scheme.

In one embodiment, the signal integrity system 450 determines optimal termination values for one or more non-enabled receivers of a point-to-multipoint connection that are coupled to a connection under test by the signal integrity system 450. With reference to the PCB 300 of FIG. 3, for example, the termination for non-enabled receiver 322 may be determined while the system integrity system 450 monitors transmission of one or more know signals from driver 312 to enabled receiver 332. In this example, the system integrity monitor 450 may determine terminations for one or more non-enabled receivers that are coupled to a connection with an enabled receiver. With regard to FIG. 3, for example, the optimal termination values for termination components of the driver 312 and receivers 322, 332 may vary depending on which of the receivers is enabled to receive one or more test signals transmitted from the driver 312. Table 1, below, illustrates exemplary termination component values for the PCB 300 of FIG. 3 in an embodiment where the signal integrity monitor 450 is configured to determine optimal termination values for all drivers/receivers coupled to a selected connection (e.g., connection 316 of PCB 300).

TABLE 1

| Termination Component | Optimal Component Value Receiver 322 enabled Receiver 332 not enabled | Optimal Component Value Receiver 322 not enabled Receiver 332 enabled |
|---|---|---|
| Resistor 314 | 10 ohm | 33 ohm |
| Resistor 324 | 22 ohm | 10 ohm |

TABLE 1-continued

| Termination Component | Optimal Component Value Receiver 322 enabled Receiver 332 not enabled | Optimal Component Value Receiver 322 not enabled Receiver 332 enabled |
|---|---|---|
| Capacitor 326 | 0.01 uf | 0.02 uf |
| Resistor 334 | 33 ohm | 22 ohm |
| Capacitor 338 | 0.02 uf | 0.01 uf |

In one embodiment, the component values of Table 1 are determined by alternatively enabling the receiver 322 and receiver 332 and performing a signal integrity test on the point-to-multipoint connection, such as the method of FIG. 9. As illustrated in exemplary Table 1, there are no common values for a respective component with either receiver enabled. For traditional designs, such a scenario may require re-design of the PCB using alternative connection topologies and/or chips, for example. However, according to the systems and methods described herein, the PCB 300 may be designed so that when in use the on-chip terminations adjust termination component values depending on a currently enabled receiver. For example, with reference to FIG. 3 and the exemplary Table 1 values, the on-chip terminations associated with the driver 312 and receivers 322, 332, may be adjusted depending on which of the receivers 322, 332 is enabled. In particular, when receiver 322 is enabled and receiver 332 is not enabled, the termination values may be set to those values in column 2 of Table 1 (e.g., Resistor 314=10 ohm, Resistor 324=22 ohm, etc.). Similarly, when receiver 332 is enabled and receiver 322 is not enabled, the termination values may be set to those values in column 3 of Table 1 (e.g., Resistor 314=33 ohm, Resistor 324=10 ohm, etc.) Thus, in certain embodiments on-chip termination values can be customized for certain bus transaction. In one embodiment, the on-chip termination values are software programmed to corresponded with control signals, such as, for example, write-enable signals, such that the termination values are adjusted depending on which drivers and/or receivers are enabled. Accordingly, in certain embodiments, PCBs may be designed to include on-chip terminations that adjust termination component values while the PCB is in use.

In one embodiment, the system integrity module 590 can atomically decide the proper termination of a connection disregarding the effects of other neighboring connections or nodes.

Moving to decision block 840, the signal integrity system 450 determines if additional connections remain to be tested. In one embodiment, each of the connections in the determined connections (block 810) are tested, such as sequentially. In other embodiments, the signal integrity system 450 makes a realtime determination as to whether additional connections remained to be tested. If there are additional connections between or more components to be tested, then method continues to block 860 where another connection is selected for testing and then to block 830 where the selected connection is tested for signal integrity using each of a plurality of termination schemes. If there are no further connections to be tested, the method moves to block 850 where the results of the signal integrity testing using different termination schemes are analyzed by the signal integrity module 590.

In block 860, the termination scheme chosen for a particular connection may be at least partly based on where the PCB 300 will be situated. For example, if the resulting PCB 300 is implemented in a home computer, such as a motherboard, then the resulting termination scheme(s) may correspond with an ambient profile corresponding to a home or office environment. In another embodiment, the determined termination scheme(s) are chosen based at least partly on the speed of the implemented system. For example, if the resulting PCB 300 will be implemented in a high-speed environment, different termination scheme(s) corresponding to a high temperature and low impedance may be selected by the signal integrity module 590. FIG. 13, described in further detail below, illustrates an exemplary method of selecting optimal termination schemes for drivers and/or receivers coupled to a connection on the tested PCB.

FIG. 9 is a flowchart illustrating one embodiment of programmatically adjusting termination values of series and/or AC terminations coupled to a connection of a PCB in order to determine optimal values for the terminations in maintaining signal integrity on the connection. Depending on the embodiment, the flowchart of FIG. 9 may comprise fewer or more blocks and the blocks may be performed in a different order than illustrated.

In block 910, the test module 580 selects a first possible termination scheme (e.g. resistance and/or capacitance values) for a selected driver and/or receiver. Exemplary lists of series and AC termination schemes are illustrated in FIG. 10. In one embodiment, the test module 580 initially selects a termination scheme for the series termination of the driver, such as the driver 312 of chip 310, and then cycles through each of the AC termination schemes for the receiver, such as the receiver 322. Thus, with reference to FIG. 10, the termination schemes selected in block 910 may be series termination scheme 1 (e.g., the series termination for driver 312 is to be set to 10 Ohms) and AC termination scheme 1 (e.g., the resistor 326 is to be set to 10 Ohms and the capacitor 324 is to be set to 0.001 microFarads. In other embodiments, termination schemes may be selected in any other manner and in any other order. For example, in one embodiment the test module 590 selects termination schemes based on the impedance of the PCB 300 tracers characteristics. For example, many PCBs comprise FR-4 PCB laminate, which generally has an impedance of either 50 ohms or 75 ohms. Thus, when characterizing a PCB comprising such an impedance, termination schemes comprising resistance values of slightly less than the PCB impedance, e.g., 33.2 ohms for a 50 ohm PCB impedance and 60 ohms for a 75 ohm PCB 300 impedance, may be selected.

Moving to block 920, the termination scheme selected in block 910 is then programmed in the software programmable on-chip resistor(s)/capacitor(s) in the IC/component, such as by setting appropriate register values of the on-chip termination components via a connection interface between the signal integrity system and the PCB. For example, if AC termination scheme 4 of FIG. 10 (row 1010) is selected for receiver 322 (FIG. 3), the resistor 326 is programmed to 10 Ohms and the capacitor 328 is programmed to 1 microFarad. Similarly, if series termination scheme 2 of FIG. 10 (row 1020) is selected for driver 312, the resistor 314 is programmed to 22 Ohms. In one embodiment, the test module 580 simulates the effects of various termination schemes on a driver output and/or a receiver input for drivers and/or receivers that do not include on-chip programmable termination components.

Continuing to block 930, the selected driver is programmed to transmit a known signal. For example, the driver 310 of PCB 300 (FIG. 3) may be programmed to transmit a known signal by storing a corresponding value in a register associated with the driver 312. Depending on the embodiment, the known signal may correspond to a logical "1" or a logical "0" in the digital realm, or to any other analog signal.

In block 940, the test module 580 monitors the value of the signal received by the selected receiver, such as the receiver 322. In one embodiment, a register associated with the selected receiver is accessed by the test module 580 in order to determine a value of the received signal.

Moving to block 950, the monitored values of the signal transmitted from the driver and/or received by one or more receivers are recorded to a log file. In one embodiment, the recorded values are composed of a linear array of logical ones and local zeros. It will be appreciated by those skilled in the arts that digital signals are often distorted in some fashion. For example, if the driver 312 outputs a logical zero and the receivers 322, 332 receive an electrical signal corresponding to a digital value of 0.8, then there is some discrepancy of whether the 0.8 values correspond to a logical zero or a logical one. In one embodiment, the test module 580 decides any value from the register of the receivers 322, 332 greater than or equal to 0.5 corresponds to a logical one and any value ranging from 0-0.49 from the register of the receiver 322, 332 less than 0.5 corresponds to a logical zero. In another embodiment, the test module might run several tests between the driver 312 and receivers 322, 332 to determine the recorded value.

Continuing to block 960, the test module 580 determines whether additional termination schemes might be tested. If there are more additional termination schemes which need to be tested, the method moves to block 970. If there are no more termination schemes to be tested, then the method moves to block 980 where the optimal termination scheme(s) are selected based on the recorded values of block 950. In one embodiment, the test module 580 tests signal integrity across the selected connection using every combination of provided AC and series terminations, such as those illustrated in tables 1020, 1022 of FIG. 10. In other embodiments, only limited quantities of possible termination schemes are tested for a particular PCB, group of connections, or connection. In one embodiment, the system integrity module 590 analyzes the values recorded in block 950 and makes a real time determination as to whether additional termination schemes need to be tested. For example, if the system integrity module 590 determines that the signal integrity using an already tested combination of series and AC termination schemes is optimal, testing of additional termination schemes may not be necessary.

In block 970, the test module 580 selects another termination scheme to be tested. In one embodiment, the test module 580 selects the next termination scheme in a list of termination schemes, such as the AC termination table 1020 or series termination table 1022 of FIG. 10. In another embodiment, the test module and/or system integrity module 590 determine a next termination scheme at least partly on the results of the previous termination scheme. For example, if the resistance value chosen for driver 214 of FIG. 2 was selected from row 1010 (resistance value of 10) and the impedance of the PCB 200 was 75 ohms, then the test module 590 may not linearly go to row 1015 where the resistance value is 10 ohms, but may instead jump to row 1030 where the resistance value is 62 ohms which is closer to the PCB 200 impedance.

Moving to block 980, the optimal termination scheme for the selected driver and receiver are selected by the signal integrity module 590. In one embodiment, the optimal termination schemes are selected based on the recorded values in the log file. In one embodiment, the optimal termination scheme may be different that any of the termination schemes used in the testing process, such as an interpolated resistance and/or capacitance.

FIG. 10 illustrates an exemplary AC termination table 1020, an exemplary series termination table 1022, and an exemplary ambient profile table 1024. The ambient profile table 1024 comprises 9 combinations of humidity and temperature at which signal integrity of PCBs may be tested. If each of the ambient profiles of ambient profile table 1024 are used in testing a PCB, the PCB will have been tested at three temperatures at each of three humidities. Depending on the embodiment, the ambient profiles may be selected for testing in any order. For example, the profiles may be selected in a linear order from A-I or from I-A, or in any other order. In other embodiments, the ambient profiles comprise fewer or more humidity and/or temperature gradations. In some embodiments, only one of temperature and humidity are adjusted in the different ambient profiles.

In the embodiment of FIG. 10, the AC and series termination tables 1020, 1022 illustrate exemplary values of resistors and capacitors. In other embodiments, additional or fewer resistor and/or capacitor values may be included as termination schemes. Additionally, other values of resistor and capacitor values may be used. Additionally, in certain embodiments, only one of the resistance and capacitance levels are adjusted in the AC termination table 1020. For example, in one embodiment the programmable resistor of an AC termination is set to a value, e.g., 39 Ohms, and maintained at that value as the corresponding programmable capacitor is adjusted between various values, e.g., 0.001, 0.01, 0.1, and 1 microFarads.

With reference to the AC termination table 1020, row 1010 indicates a resistance value of 10 Ohms and a capacitance value of 1 microFarad for a termination scheme 4. Row 1020 of the series termination table 1022 indicates a resistance value of 22 Ohms for a termination scheme 2. In one embodiment, the termination scheme numbers of the AC termination table 1020 and series termination table 1022 may differ. Row 1031 of the ambient profile table 1024 indicates a Profile B having 0% humidity and a 27° C. temperature. In one embodiment, the ambient profile table 1024 indicates the ambient conditions of the test environment 600. In one embodiment, additional ambient characteristics, such as wind speed, may be included in the ambient profile table 1024.

In one embodiment, each of the series termination schemes is maintained on a driver while each of the AC terminations are tested on the receiver. In this embodiment, each combination of series and AC termination schemes are tested. In other embodiments, only selected combinations of series and AC termination schemes are tested.

FIG. 11 is an exemplary log file indicating test results using various ambient profiles and termination schemes. The exemplary log file 1100 includes an ambient profile column 1110, a termination scheme column 1120, a driver register value columns 1130, a receiver register value column 1140, a match flag column 1150, and a sequential matches column 1160. As illustrated in FIG. 11, a first ambient profile 'A' was provided while testing 6 different termination schemes with each of a high and low driver output signal. The driver's register value 1130 indicates a value of an output of the driver and the receiver register value column indicates a value of the signal received by the receiver. Thus, if the values in any row of columns 1130 and 1140 match, the connection carried the signal without significant degradation. However, if the values in rows column 1130 and 1140 do not match, e.g., a "1" was transmitted, but a "0" was received, the connection was subject to degradation and the corresponding termination scheme should not be selected for use in the PCB. The match column 1150 indicates whether the driver output and receiver input match, where a "1" indicates a match and a "0" indicates a mismatch. The sequential matches column 1160 indicates a quantity of sequential matches of output and input, assuming the test module 580 steps through the ambient profiles and termination schemes in the order illustrates (e.g., from the top of the chart to the bottom). By looking at the sequential matches, the signal integrity module may identify a range of termination schemes and or ambient profiles that maintain acceptable signal integrity.

With reference to the exemplary log values illustrated in FIG. 11, which may be assumed to be received through testing of PCB 300, row 1161 shows an ambient profile "A" selected and a termination scheme "3" selected. Row 1161 also shows a driver register 312 value corresponding to a logical "0" and receivers 322 register value corresponding to a logical "0." Since the driver 312 register value is the same as the receiver 322 register value, the match flag shows a logical "1." Also, since the driver's 312 register value matched the receivers 322 register value for the first time, then the number of sequential matches is one as shown in the sequential matches column 1160. Accordingly, rows 1162, 1163, 1164, and row 1165 all show the driver register 312 having the same value as the receiver 322 register value so the number of sequential matches increments to 5 in the sequential matches column 1160.

The log of FIG. 11 includes data for variations in only a single termination scheme. Thus, in one embodiment each termination scheme includes values for each of a resistor and capacitor of an AC termination, as well as values for a resistors of a series termination. In one embodiment, each termination scheme comprises values for multiple resistors and capacitors of multiple AC terminations, as well as values for a resistors of a series termination. In other embodiments, a series termination (or AC termination) is set to a know value and a plurality of termination schemes for the AC termination (or series termination) are tested.

Figure 12:
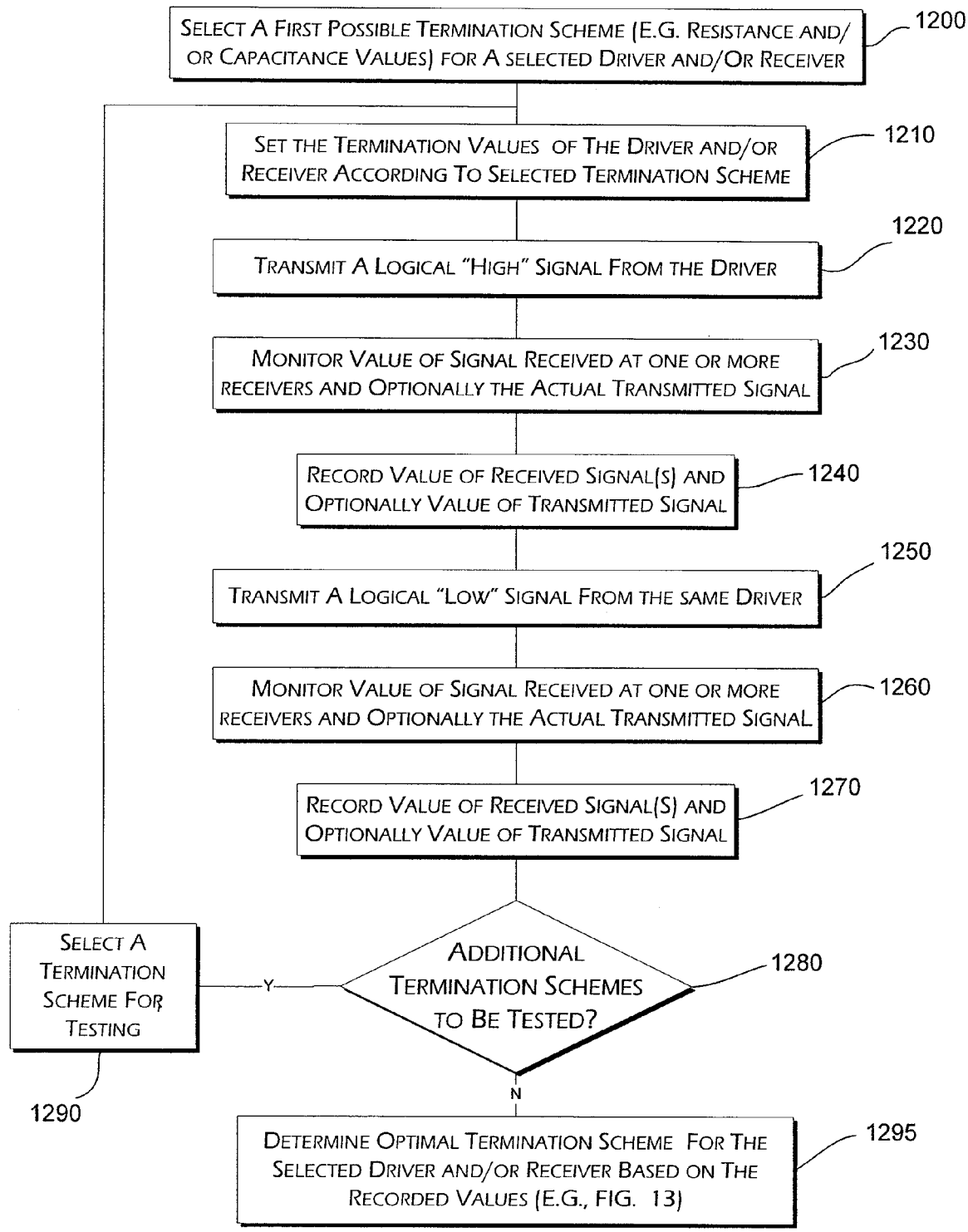
FIG. 12 is a flowchart illustrating one embodiment of a method of testing multiple termination schemes associated with a connection on a PCB.

FIG. 12 is a flowchart illustrating one embodiment of a method of testing multiple termination schemes associated with a connection on a PCB. In one embodiment, the termination schemes comprise values for components of series and/or AC terminations coupled to either end of the connection, where the component values are adjustable via on-chip components. In one embodiment, for example, the method of FIG. 12 illustrates a method of testing one of the termination schemes of FIG. 10. Depending on the embodiment, the flowchart of FIG. 12 may comprise fewer or more blocks and the blocks may be performed in a different order than illustrated.

Beginning in block 1200, a first possible termination scheme (e.g. resistance and/or capacitance value) is selected for a selected driver and/or receiver that are coupled to a selected connection of the PCB. For illustrative purposes, the method of FIG. 12 will be discussed with reference to testing of termination schemes associated with the connection 316 between driver 312 and receiver 322 (FIG. 3). However, the method may be used for testing of termination schemes of any connection. In one embodiment, the termination schemes could come from the exemplary tables in FIG. 10. In another embodiment, the termination schemes could come from the signal integrity system 450 which will intelligently decide what termination values to use based on the impedance of the PCB 300 and other factors, such as ambient temperature and humidity, for example. For illustrative purposes, the description of FIG. 12 will refer to an exemplary termination scheme comprising component values for an on-chip series resistor of chip 310, and on-chip resistor 326 and on-chip capacitor 324 of chip 320A (FIG. 3). In other embodiments, termination schemes may comprises fewer or additional values for termination components.

Continuing to block 1210, the termination values for the terminations associated with the driver 312 and receivers 322 are set to the values indicated in the selected termination scheme. For example, the termination values for resistors 310, 326 and capacitor 326 may be programmed into registers of the software programmable components in order to set the termination components to the desired values.

Transitioning to block 1220, a logical "high" signal is sent from the driver 312 to the receiver 322 of PCB 300. In one embodiment, the logical high corresponds to a digital value of "1." In one embodiment, the logical high value sent by driver 312 may be edge triggered on both the rising and falling edges of the clock. In another embodiment, the logical high sent by driver 312 may be asynchronous. It may be appreciated by those skilled in the arts that the logical high/low signals transmitted by the driver 312 to receiver 322 may be different from a programming value sent to driver 312 by the test module 580, where the programming value indicates a desired output of the driver 312.

In block 1230, the value of the signal received at the receiver 322 is monitored. In one embodiment, the value is either a digital "0" or "1" value. In other embodiments, the value of the received signal may be any other value, such as −1, 0, 1, 2, 3, 4, 5, or non-whole numbers, such as values of the analog voltage transmitted on the connection. In one embodiment, the driver 312 might have a self-monitoring system, which measures the output value of the driver 312 such as by storing the value in a register associated with the receiver 322.

Moving to block 1240, the value of the received signal(s) is recorded to a log file on the signal integrity system 450. Depending on the embodiment, the signal that is actually transmitted by the driver 312, rather than the signal that was supposed to be transmitted by the driver 312, is also monitored and record to a log file.

Moving to block 1250, a logical low is transmitted from the same driver 312 to one the receivers 322 on PCB 300. In one embodiment, the logical low corresponds to a digital value of "0." In one embodiment, the logical low value sent by driver 312 may be edge triggered on both the rising and falling edges of the clock. In another embodiment, the logical low sent by driver 312 may be asynchronous. It may be appreciated by those skilled in the arts that the logical high/low sent by driver 312 to receivers 322, 332 may be different from the programming value sent to driver 312 by the test module 590. In one embodiment, the method of FIG. 12 may be modified so that a logical low signal is first transmitted from the driver, followed by the logical high signal, such as by changing positions of blocks 1220 and 1250, for example.

Because the test method of FIG. 12 transmits a logical high signal and then a logical low signal, the signal integrity of both high and low signals may be tested, as well as the driver's ability to switch between output signals.

In block 1260, the value of the signal received at the receiver 322 is monitored. In one embodiment, the value is either a digital "0" or "1" value. In other embodiments, the value of the received signal may be any other value, such as −1, 0, 1, 2, 3, 4, 5, or non-whole numbers, such as values of the analog voltage transmitted on the connection. In one embodiment, the receiver 322 might have a self-monitoring system, which measures the received signal value, such as by storing the value in a register associated with the receiver 322.

Continuing to decision block 1280, the signal integrity system 450 determines if additional termination schemes need to be applied to the terminations of the selected connection. The determination if additional schemes need to be tested may depend on a wide variety of factors, such as the number of sequential matches in transmitted and received signal values, such as is illustrated in column 1160 of FIG. 11. For example, the signal integrity system 450 may be configured to sequence through available termination schemes until a predetermined number of matches of the output and input signal are detected, such as 1, 2, 3, 4, 5, 6, 7, or 8 matches, for example. In this embodiment, the method moves to block 1290 if less than the predetermined number of matches have been detected. In another embodiment, the signal integrity system 450 may be configured to sequence through available termination schemes until a predetermined number of non-matching outputs and inputs are detected, after at least a predetermined number of matching output and input signals have been detected. For example, the method may move to block 1295 if 2 termination schemes have resulting in non-matching output and input signals, after at least 1 matching set of input and output signal has been detected. In other embodiments, the number of matching and mis-matched pairs may be any values, such as 1, 2, 3, 4, 5, 6, 7, or 8, for example. In another embodiment, if the list of termination schemes is exhausted, then the method moves to block 1295.

In block 1290, a termination scheme is selected for testing. In one embodiment, the termination scheme is selected from a list of termination schemes to be tested, such as the list of termination schemes in FIG. 10. In another embodiment, the termination scheme may be a unique combination of resistance and/or capacitance value(s) to be tested.

Moving to block 1295, the signal integrity system 450 determines the optimal termination scheme for the selected driver 312 and receivers 322 based on the recorded values. The optimal termination scheme may be a unique combination of resistance and/or capacitance values determined by the signal integrity system 450. An exemplary embodiment of determining the optimal termination scheme is illustrated in FIG. 13.

FIG. 13 is a flowchart illustrating one embodiment of a method of determining the optimal termination scheme for a selected driver and/or receiver, based at least partly on the results of signal integrity testing, such as testing using the methods of FIG. 9 and/or FIG. 12. Depending on the embodiment, the method of FIG. 13 may comprise fewer or more blocks and the blocks may be performed in a different order than illustrated.

Beginning in block 1310, the signal integrity system 450 locates each matching driver's output value (e.g., the driver's register value) and receiver input value (e.g., receiver's register value) for various termination schemes and/or combinations of termination schemes associated with a selected connection. For example, the log 1100 of FIG. 11 includes match indicators in column 1150 that may be accessed in block 1310 in determining which termination schemes are associated with matching output and input values. In other embodiments, other manners of locating matching pairs of output and input signals may be implemented. In one embodiment, a termination scheme is selected only if both the high and low output signals resulted in matching high and low received signals. In embodiments where additional output signals are transmitted for a single termination scheme, such as repeated transmissions of alternating high and low signals, a termination scheme may be selected if a predetermined number, such as 90%, 95% or 100%, for example, of the transmitted and received test signals matched.

Continuing to block 1320, a substantially median termination scheme from the located termination schemes is determined. For example, if three termination schemes are located as having matching driver output and receiver input, then second of the three termination schemes may be selected in block 1320. With reference to the exemplary log of FIG. 11, the sequential matches column 1160 may be accessed in order to determine a median termination scheme from the located termination schemes (block 1310). For example, cells 1167, 1168, 1169, 1170, 1171 in the sequential matches column 1160 all show an appropriate match (e.g. their corresponding entries in the match flag column 1150 shows a logical "1"), so there are five sequential matches. In this embodiment, the median termination scheme would be cell 1169, which corresponds to ambient profile A and termination scheme #4. In one embodiment, if there are an even number of sequential matches, then the signal integrity system 450 would choose a termination scheme between those two sequential matches, e.g., by interpolating component values between the component values of the two matching termination schemes. In another embodiment, if there are an even number of sequential matches, the signal integrity system 450 selects one of the termination schemes. In another embodiment, the signal integrity system 450 would notify the user with an appropriate GUI interface to select the proper termination scheme.

Moving to block 1330, the termination scheme for the selected connection is to the determined termination scheme. In one embodiment, the termination components are automatically programmed to the values indication in the determined termination scheme via their on-chip programmable components.

The foregoing description details certain embodiments of the invention. It will be appreciated, however, that no matter how detailed the foregoing appears in text, the invention can be practiced in many ways. For example, the above-described signal integrity testing and optimization methods may be performed on other types of electronic boards, in addition to PCBs. As is also stated above, it should be noted that the use of particular terminology when describing certain features or aspects of the invention should not be taken to imply that the terminology is being re-defined herein to be restricted to including any specific characteristics of the features or aspects of the invention with which that terminology is associated. The scope of the invention should therefore be construed in accordance with the appended claims and any equivalents thereof.

What is claimed is:

1. A computerized method for determining termination characteristics associated with a connection between a signal driver of a first chip on a printed circuit board and a signal receiver of a second chip on the printed circuit board, at least one of the first and second chips comprising one or more of a software programmable resistor and a software programmable capacitor coupled to the connection, the method comprising:

(a) determining one or more possible values for at least one of the programmable resistor and the programmable capacitor;

(b) selecting one of the determined possible values for the at least one of the programmable resistor and the programmable capacitor;

(c) transmitting a first signal to the at least one of the programmable resistor and the programmable capacitor coupled to the connection, the signal configured to initiate adjustment of at least one of a resistance value of the programmable resistor and a capacitor value of the programmable capacitor to the selected one of the determined possible values;

(d) transmitting a second signal to the first chip, initiating output of a test signal having a known value from the signal driver to the signal receiver;

(e) receiving a third signal from a component on the printed circuit board indicating a received value of the test signal received by the signal receiver of the second chip;

(f) determining a signal integrity of the test signal based at least partly on a difference between the known value of the transmitted test signal and the received value of the test signal;

(g) repeating steps (b)-(e) for at least some of the determined possible values; and (h) determining values for at least one of the programmable resistor and the programmable capacitor based at least on a comparison of the determined signal integrities associated with respective possible values of at least one of the programmable resistor and the programmable capacitor.

2. The computerized method of claim 1, wherein the first, second, and third signals are communication via one or more of a Joint Test Action Group (JTAG), in-circuit emulator (ICE), on-circuit debugger (OCD), and background debug module (BDM) interface coupled between the printed circuit board and a signal integrity computing system.

3. The computerized method of claim 1, wherein the first chip comprises the programmable resistor.

4. The computerized method of claim 3, wherein the second chip comprises the programmable capacitor.

5. The computerized method of claim 3, wherein the programmable resistor is in series with the first chip and the second chip.

6. The computerized method of claim 1, wherein at least a portion of the first signal is stored in a resistor programming register, the programmable resistor being configured to adjust towards a value indicated in the resistor programming register.

7. The computerized method of claim 1, wherein at least a portion of the first signal is stored in a capacitor programming register, the programmable capacitor being configured to adjust towards a value indicated in the capacitor programming register.

8. The computerized method of claim 1, wherein the printed circuit board is positioned in an ambient chamber configured to programmatically adjust at least one of a temperature and humidity within the ambient chamber in response to signals received from a computing device positioned outside of the ambient chamber.

9. The computerized method of claim 8, further comprising repeating steps (a)-(h) with the ambient chamber adjusted to each of a plurality of temperatures.

10. The computerized method of claim 9, further comprising repeating steps (a)-(h) with the ambient chamber adjusted to each of a plurality of humidities.

11. The computerized method of claim 1, determining a signal integrity of the test signal based at least partly on a difference between the known value of the transmitted test signal and the received value of the test signal.

12. A system for determining values of each of a plurality of terminations coupled to connections between chips on a printed circuit board, the system comprising:
a test environment for housing the printed circuit board;
a computing device configured to output signals to the printed circuit board, the output signals configured to sequentially adjust resistance values of digitally programmable resistors of chips on the printed circuit board in order to adjust termination characteristics of corresponding terminations, wherein the computing device is further configured to initiate transmission of one or more known signals across electrical connections between chips on the printed circuit board as resistance values of the digitally programmable resistors are being sequentially adjusted and to determine resistance values that substantially optimize integrity of the known signals across respective connections,
wherein said test environment comprises a chamber configured to adjust at least one of temperature and humidity in response to signals from the computing device.

13. The system of claim 12, wherein the chamber comprises a substantially hermetic chamber.

14. The system of claim 12, wherein the known signals comprise one or more of a digital zero and a digital one.

15. The system of claim 12, wherein the output signals further comprise an indication of capacitance values of digitally programmable capacitors of chips on the printed circuit board.

16. A method of determining a resistance value for a driver termination on a chip, the method comprising:
(a) selecting a resistor value from a plurality of resistor values of an on-chip programmable resistor of the chip, wherein the on-chip programmable resistor is related to the driver termination of the chip;
(b) transmitting from a computing device to the chip a signal indicating the selected resistor value;
(c) adjusting the on-chip programmable resistor towards the selected resistor value;
(d) transmitting from a computing device to the chip a communication signal indicating a test signal to be output from a driver of the chip, the driver being electrically coupled to a connection of a printed circuit board, the connection being further coupled to a receiver of a second chip;
(e) sensing a received test signal value indicating value of the transmitted test signal that is received by the receiver of the second chip;
(f) if additional resistor values remain to be tested, repeating steps (a)-(d);
(g) determining the resistance value for the on-chip programmable resistor based at least partly on a comparison of respective test signals and received test signals associated with respective resistor values.

17. The method of claim 16, wherein the test signal comprises one of a logic high and a logic low value.

18. The method of claim 16, wherein the test signal comprises one of a digital "1" and a digital "0".

19. The method of claim 16, wherein the on-chip resistor is in series with the driver of the chip and the receiver of the second chip.

20. The method of claim 16, wherein the optimal resistor value is a resistor value associated with a particular test signal and received test signal that are substantially equal.

21. The method of claim 16, wherein the optimal resistor value is a median resistor value of a plurality of resistor values associated with matching respective test signals and received test signals.

22. The method of claim 16, further comprising:
transmitting from the computing device to the chip a signal indicating a selected capacitance value;
adjusting an on-chip programmable capacitor of the chip towards the selected capacitance value.

23. The method of claim 16, further comprising:
transmitting from the computing device to the second chip a signal indicating a second selected resistance value for a second on-chip programmable resistor of the second chip;
adjusting the second on-chip programmable resistor of the second chip towards the second selected resistance value.

* * * * *